United States Patent [19]
Mori et al.

[11] Patent Number: 6,075,202
[45] Date of Patent: Jun. 13, 2000

[54] SOLAR-CELL MODULE AND PROCESS FOR ITS PRODUCTION, BUILDING MATERIAL AND METHOD FOR ITS LAYING, AND ELECTRICITY GENERATION SYSTEM

[75] Inventors: Masahiro Mori, Soraku-gun; Akiharu Takabayashi; Toshihiko Mimura, both of Nara; Takeshi Takada, Kyotanabe; Ayako Komori, Joyo, all of Japan

[73] Assignee: Canon Kabushiki Kaisha, Tokyo, Japan

[21] Appl. No.: 09/066,857

[22] Filed: Apr. 28, 1998

[30] Foreign Application Priority Data

May 7, 1997 [JP] Japan ................................. 9-116854

[51] Int. Cl.$^7$ .................................................. H01L 25/00
[52] U.S. Cl. ........................... 136/251; 136/259; 52/173.3
[58] Field of Search ................................. 136/251, 259; 52/173.3

[56] References Cited

U.S. PATENT DOCUMENTS

| | | | |
|---|---|---|---|
| 5,589,006 | 12/1996 | Itoyama | 136/248 |
| 5,679,176 | 10/1997 | Tsuzuki | 136/251 |
| 5,728,230 | 3/1998 | Komori et al. | 136/251 |
| 5,768,831 | 6/1998 | Melchior | 52/173.3 |
| 5,776,262 | 7/1998 | Melchior | 136/251 |

FOREIGN PATENT DOCUMENTS

| | | |
|---|---|---|
| 0 625 802 | 11/1947 | European Pat. Off. . |
| 5-121772 | 5/1993 | Japan . |
| 95/08193 | 3/1995 | WIPO . |

*Primary Examiner*—Mark Chapman
*Attorney, Agent, or Firm*—Fitzpatrick, Cella, Harper & Scinto

[57] ABSTRACT

A solar-cell module is provided which comprises a photovoltaic device sealed on a reinforcing sheet with a filler material, wherein the reinforcing sheet has unevenness formed by plastic deformation, on its surface at least on the side of the photovoltaic device and at least partly on the surface, and a space defined by the unevenness and the photovoltaic device is filled with the filler material. The solar-cell module is produced by a process comprising the steps of superposing at least a thermoplastic-resin sheet member and a photovoltaic device on a reinforcing sheet having unevenness on its surface, and heating the thermoplastic-resin sheet member, the photovoltaic device and the reinforcing sheet while removing air from a space between the reinforcing sheet and the thermoplastic-resin sheet member and a space between the thermoplastic resin sheet member and the photovoltaic device, to bring them into close contact to fix to each other.

A solar-cell module can thereby be provided which has no trapped air portions that may be formed between the filler material and the reinforcing sheet when the photovoltaic device is sealed with the filler material and fixed onto the reinforcing sheet to produce the solar-cell module.

43 Claims, 7 Drawing Sheets

SOLAR-CELL MODULE AND PROCESS FOR ITS PRODUCTION, BUILDING MATERIAL AND METHOD FOR ITS LAYING, AND ELECTRICITY GENERATION SYSTEM

BACKGROUND OF THE INVENTION

1. Field of the Invention

This invention relates to a solar-cell module comprising a photovoltaic device sealed on a reinforcing sheet with a filler material, a process for its production, a building material making use of it, a method for laying the building material, and an electricity generation system.

2. Related Background Art

Solar-cell modules employing reinforcing sheets on their back sides are known in the art. As an example thereof, a general-purpose solar-cell module having an aluminum frame material as shown in FIG. 8 will be briefly described below.

FIG. 8 is a perspective view showing a conventional solar-cell module. Reference numeral 1 denotes a solar-cell module; 2, a photovoltaic device; and 7, a frame. FIG. 9 is an enlarged cross-sectional view along the cross section 9—9 in FIG. 8.

How the solar-cell module 1 of this example is made up will be described with reference to FIG. 9. The solar-cell module 1 of the present example comprises a photovoltaic device 2 resin-sealed with a light-transmissive resin 3. The light-transmissive resin 3 functions as a filler material for sealing the photovoltaic device and also fixing the device onto a reinforcing sheet. In this example, the solar-cell module 1 has a light-transmissive surface protective film 4 on the outermost surface on its light-receiving side and has a metallic reinforcing sheet as a reinforcing sheet 105. These are bonded through the light-transmissive resin 3 into a laminate.

The solar-cell module 1 is provided with an aluminum frame 7 on its side portion. Using this aluminum frame, the solar-cell module 1 can be fixed to any desired place. From the solar-cell module 1 of the present example, its electricity is outputted through a cable 10 led out of a terminal lead-out box 8 fixed to the reinforcing sheet 5 with an adhesive 9.

An example of how to make a solar-cell module by sealing-and-fixing will be briefly described below. First, as constituent materials used to produce the solar-cell module by sealing and fixing the photovoltaic device, the following ones are prepared.

For example, an EVA resin (ethylene-vinyl acetate copolymer) is formed into a sheet of 450 μm thick as a filler material which covers the surface and back of the photovoltaic device and also has the function to bond other constituent materials provided on its outer surfaces, and two sheets are prepared for the top and the back. Also, for example, a fluorine resin film of 50 μm thick is prepared as a surface protective film. Still also, for example, a galvanized steel sheet of 0.4 mm thick is prepared as a reinforcing sheet provided on the back of the solar-cell module.

Here, as the photovoltaic device, a photovoltaic device formed of, e.g., amorphous silicon is prepared. This is a photovoltaic device comprising a stainless steel substrate of 125 μm thick and formed thereon an amorphous silicon semiconductor layer.

The constituent materials thus prepared are sealed and fixed by contact bonding with heating. FIG. 10 is a perspective view showing an example of a sealing-and-fixing jig. FIG. 11 is a cross section corresponding to the part along the line 11—11 in FIG. 10, which shows a course of procedure during which materials for producing a solar-cell module are placed on the jig. The jig, 18, is made up using a plate made of aluminum, and is so used that the photovoltaic device and the material that constitutes the filler material are placed thereon. In the plate made of aluminum, in order for it to function as the jig, a groove 19 is provided along its outer sides in such a way that the groove surrounds the region where the photovoltaic device and the filler material are placed, and an O-ring 20 made of a heat-resistant resin is fitted in the groove. Right on the inner side of the O-ring 20, suction holes 21 for making a vacuum are provided, which are connected to a pipe 22, and the pipe 22 is further connected to a vacuum pump (not shown). The pipe 22 is also provided with a valve 26.

By the use of such a jig, the solar-cell module is produced, e.g., in the following way. First, a Teflon film for release 23 is spread on the surface of the jig. This is done in order to prevent the filler material EVA resin from being pressed out to adhere to the jig 18. Next, the materials prepared as described above are superposed on the jig. More specifically, as the reinforcing sheet, the galvanized steel sheet of 0.4 mm thick is placed at the lowest position, and on this sheet the EVA resin formed into a sheet of 450 μm thick as the filler material, the amorphous silicon photovoltaic device, the like EVA resin and the uppermost, fluorine resin film of 50 μm thick are successively superposed to form a laminate 24, which is then placed on the release Teflon film 23. Here, as the fluorine resin film, a sheet having a larger size than that of the EVA resin sheet is used. Thus, like the spreading of the release Teflon film on the bottom, the filler material can be prevented from being pressed out to adhere to other materials members. A silicone rubber 25 is finally placed on the laminate thus prepared, thus the materials are completely superposed on the jig 18.

Under this condition, the vacuum pump (not shown) is actuated to make the valve 26 open, so that the silicone rubber 25 is brought into close contact with the O-ring 20 and hence a closed space is formed which is defined by the silicone rubber 25, the O-ring 20 and the aluminum plate of the jig 18. The inside of the space stands vacuum. Thus, the reinforcing sheet, the filler material, the photovoltaic device, the filler material and the light-transmissive surface protective film are uniformly pressed against the jig 18 under atmospheric pressure through the silicone rubber 25.

The jig 18 standing as stated above is put into a heating oven while keeping the vacuum pump operating, i.e., while maintaining the vacuum condition. The temperature in the heating oven is maintained at a temperature higher than the melting point of the filler material. After the filler material has been heated to the temperature higher than its melting point to become soft and the time for which it completes a chemical change for exhibiting a sufficient adhesive force has lapsed, the jig kept standing vacuum is taken out of the heating oven. This is cooled to room temperature, and thereafter the vacuum pump is stopped operating, and the silicone rubber 25 is removed so as to be released from the vacuum condition. Thus, the solar-cell module can be obtained.

The solar-cell module is produced in this way. There, however, is a problem that, when the above materials are superposed and thereafter put into a vacuum, the air present between the reinforcing sheet, galvanized steel sheet and the filler material EVA resin can not be completely sucked up with the vacuum pump.

More specifically, as shown in FIG. 12, the filler material, EVA resin (light-transmissive resin) 3 and the reinforcing sheet, galvanized steel sheet 105 may undesirably be brought into close contact in such a state that they have trapped air 27 at some part between them. In FIG. 12, reference numeral 4 denotes the protective film. This may frequently occur when, e.g., the filler material EVA resin absorbs moisture and the reinforcing sheet has a very flat surface. Once they have been brought into such a state, the air 27 at that part can not be sucked up however it is tried being sucked with the vacuum pump, and it follows that the solar-cell module is produced by sealing-and-fixing as it is. As the result, there occur trapped air portions where the EVA resin and the reinforcing sheet are not in close contact.

Meanwhile, there is an increasing commercial demand for large-area solar-cell modules. The above problem may become more serious when large-sized, large-area solar-cell modules are manufactured. As solar-cell modules come to have a larger size and larger area, the distance from the middle to the end of a solar-cell module becomes larger, resulting in a great increase in resistance when the air is removed. This problem has occurred even in solar-cell modules having caused no problem of the occurrence of trapped air portions, when they are simply made larger in size so as to meet the commercial demand.

The trapped air portions may result in great damage of appearance if they are large, so that products obtained can not be brought into the market. This can be the cause of a decrease in yield of manufacture, consequently bringing about a problem of an increase in production cost.

As for an instance where the trapped air portions are small and also they are present on the back of the photovoltaic device, there is a problem that they can not be found by visual inspection before the shipment of products. What is meant by the fact that they are not found by visual inspection is that there is no problem on appearance in the initial state. However, during the long-term use of solar-cell modules, the air in such small trapped air portions repeatedly increase and decrease in volume, and hence they may grow into larger trapped air portions. This may cause a problem on appearance. Also, in the course of such growth, the trapped air portions may internally cause a phenomenon of sweating or moisture condensation to gather water content. In such an instance, the water content may permeate into the photovoltaic device to cause a problem of lowering electrical performance of the photovoltaic device in some cases.

SUMMARY OF THE INVENTION

To solve the problems as discussed above, the present invention provides a solar-cell module comprising a photovoltaic device sealed on a reinforcing sheet with a filler material, wherein the reinforcing sheet has unevenness (concavo-convex shape) formed by plastic deformation on its surface at least on the side of the photovoltaic device and at least partly on the surface, and a space defined by the unevenness and the photovoltaic device is filled with the filler material.

As a preferred embodiment, the present invention also provides a solar-cell module comprising a photovoltaic device sealed on a reinforcing sheet with a filler material, wherein the reinforcing sheet has unevenness on its surface at least on the side of the photovoltaic device and at least partly on the surface, and a space defined by the unevenness and the photovoltaic device is filled with the filler material; a width of each convex portion of the unevenness and a center distance between convex portions thereof which are adjacent to each other being in the range of from 0.1 mm to 50 mm, and a height of each convex portion being in the range of from 0.1 mm to 10 mm.

As another preferred embodiment, the present invention still also provides a solar-cell module comprising a photovoltaic device sealed on a reinforcing sheet with a filler material, wherein the reinforcing sheet has unevenness in which convex and concave portions are arranged in lines on its surface at least on the side of the photovoltaic device and at least partly on the surface, and a space defined by the unevenness and the photovoltaic device is filled with the filler material.

The present invention further provides a process for producing a solar-cell module, comprising the steps of:

superposing at least a thermoplastic-resin sheet member and a photovoltaic device on a reinforcing sheet having unevenness on its surface; and heating the thermoplastic-resin sheet member, the photovoltaic device and the reinforcing sheet while removing air from a space between the reinforcing sheet and the thermoplastic-resin sheet member and a space between the thermoplastic-resin sheet member and the photovoltaic device, to bring them into close contact to fix to each other.

DESCRIPTION OF THE PREFERRED EMBODIMENTS

Figure 1:
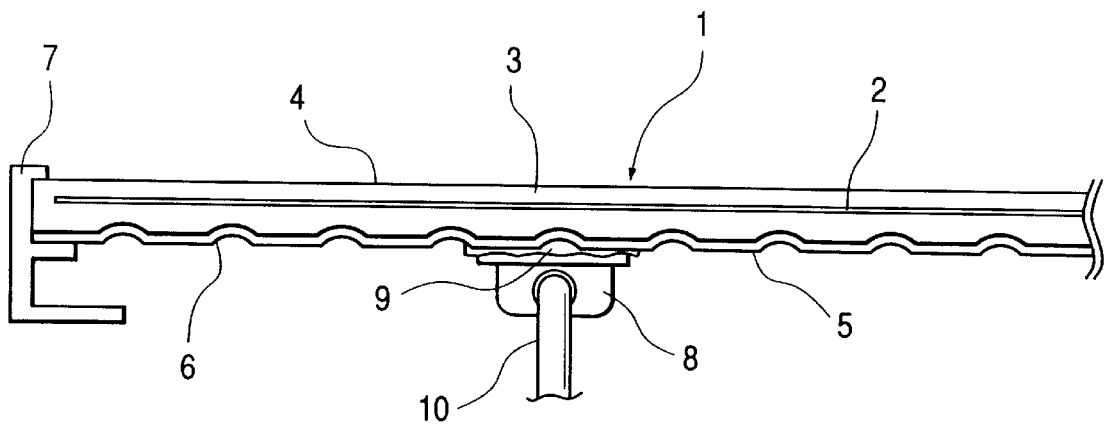
FIG. 1 is a cross-sectional view of a solar-cell module according to the present invention.

An example of preferred embodiments of the solar-cell module according to the present invention will be described below by reference to FIG. 1. A solar-cell module 1 according to the present invention comprises a photovoltaic device 2 resin-sealed with a light-transmissive resin 3. The light-transmissive resin 3 functions as a filler material for sealing the photovoltaic device and also fixing it onto a reinforcing sheet 5. The light-transmissive resin may be a thermoplastic sheet member. In this example, the solar-cell module 1 has a light-transmissive surface protective film 4 on the outermost surface on its light-receiving side and has a reinforcing sheet on the back. These are bonded through the light-transmissive resin (filler material) 3 to seal the photovoltaic device.

The solar-cell module 1 is provided with a frame 7 on its side portion. Using this frame 7, the solar-cell module 1 can be fixed to any desired place. From the solar-cell module 1 of the present example, its electricity is outputted through a cable 10 led out of a terminal lead-out box 8. The terminal lead-out box 8 is fixed to the reinforcing sheet 5 with an adhesive 9.

Figure 2:
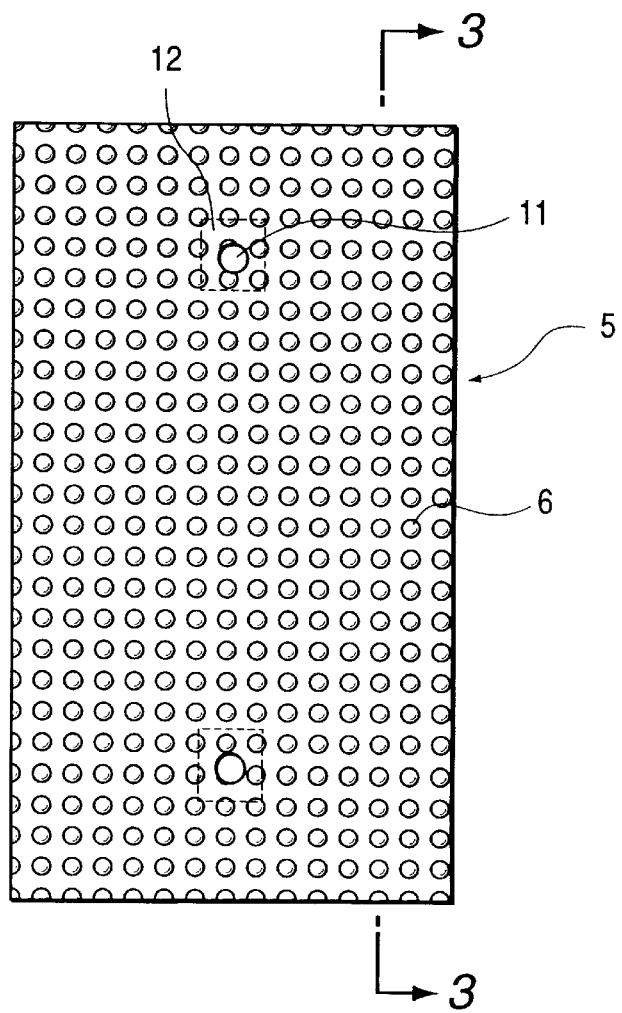
FIG. 2 illustrates an example of a reinforcing sheet used in the solar-cell module of the present invention.
Figure 3:
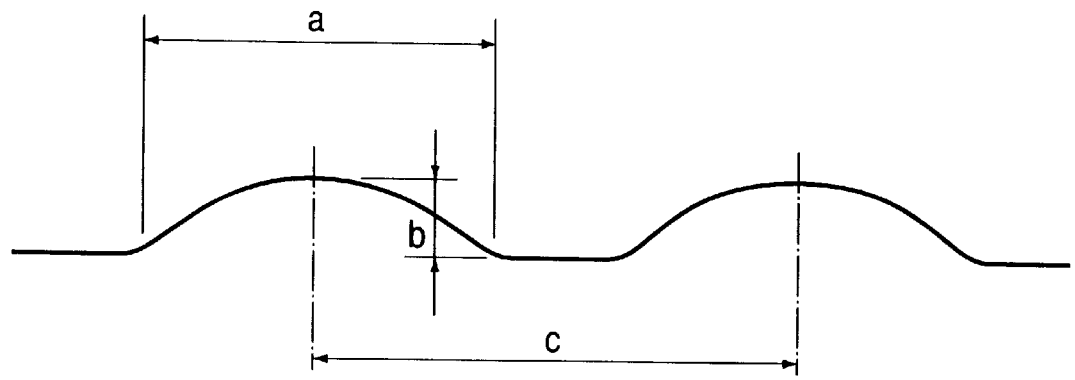
FIG. 3 is a partially enlarged cross-sectional view of an example of a reinforcing sheet used in the solar-cell module of the present invention.

The surface of the reinforcing sheet has unevenness. FIG. 2 shows an example of the unevenness, which is an example in which a plurality of convex portions are formed on the reinforcing sheet 5 on its surface on the side of the photovoltaic device. In FIG. 2, reference numeral 11 denotes a hole; and 12, a region where the terminal lead-out box 8 is bonded (terminal lead-out box bonding region). FIG. 3 is a partially enlarged cross-sectional view at the cross section along the line 3—3 in FIG. 2. In FIG. 3, letter symbol a denotes the width of a convex portion; D, the height of a convex portion; and C, the center distance between convex portions adjacent to each other. Such unevenness can be formed by, e.g., causing plastic deformation. For example, when the reinforcing sheet is made of a metal, such a shape can be formed by press molding. When it is made of a plastic sheet, such a shape can be formed by curing a plastic material with use of a mold having unevenness.

Since the reinforcing sheet has the unevenness on its surface, the filler material 3 and the reinforcing sheet 5 can be prevented from being brought into close contact in the state where trapped air portions are formed between them, when the photovoltaic device is sealed. This is because the presence of unevenness shape in the reinforcing sheet makes it hard for trapped air portions to be trapped when the reinforcing sheet and the filler material sheet are brought into close contact and also makes it easy for the air to be removed along the concavo-convex shape. Thus, the yield in the manufacture of solar-cell modules can be very improved. Also, there can be no possibility of causing a lowering of electrical performance of photovoltaic devices which might be caused by the trapped air portions, bringing about a great improvement in reliability.

Compared with an instance where the reinforcing sheet has a smooth surface, the reinforcing sheet having the unevenness can have a larger area of contact with the filler material, which leads to a greater adhesive force. This makes very small the possibility of separation of the filler material from the reinforcing sheet and brings about an improvement in long-term reliability.

In addition, since the reinforcing sheet may have the unevenness also on the back, the back of the solar-cell module cab be made to have a large surface area. This enables improvement in heat dissipation efficiency of the solar-cell module. Especially when solar-cell modules are installed as described later by reference to FIG. 13C and the air passing through their backs is utilized as a heat energy source, it is a great advantage for the module to have a high heat dissipation efficiency.

In the unevenness of the reinforcing sheet, the width (a in FIG. 3) of each convex portion and the center distance (c in FIG. 3) between convex portions adjacent to each other may preferably be in the range of from 0.1 mm to 50 mm, and more preferably from 1 mm to 10 mm, and the height (b in FIG. 3) of each convex portion may preferably be in the range of from 0.1 mm to 10 mm, and more preferably from 0.5 mm to 5 mm. If these values of the unevenness are larger than these ranges, the air may be removed with difficulty. If these values are smaller than these ranges, the solar-cell module may have a low heat dissipation efficiency.

The solar-cell module produced as described above is finally installed with the terminal lead-out box 8 and cable 10 used for the output of electricity. To describe this step briefly, it comes as follows: The hole 11 as shown in FIG. 2 is previously made in the reinforcing sheet 5 at its position corresponding to the terminal lead-out portion. The terminal is previously set exposed outward from the hole at the time of sealing. This hole is utilized to solder the terminal portion of the photovoltaic device 2 to the cable 10 to effect the output of electricity. Here, the terminal lead-out box 8 is attached for the purpose of protection and waterproofing of the terminal lead-out portion. The terminal lead-out box 8 is bonded to the reinforcing sheet 5 by the use of, e.g., a silicone type adhesive 9. This bonding also simultaneously ensures the waterproofness between the reinforcing sheet and the terminal lead-out box. The reinforcing sheet has the unevenness in the terminal lead-out box bonding region, but the silicone type adhesive takes up the unevenness to surely bond the terminal lead-out box.

Figure 4:
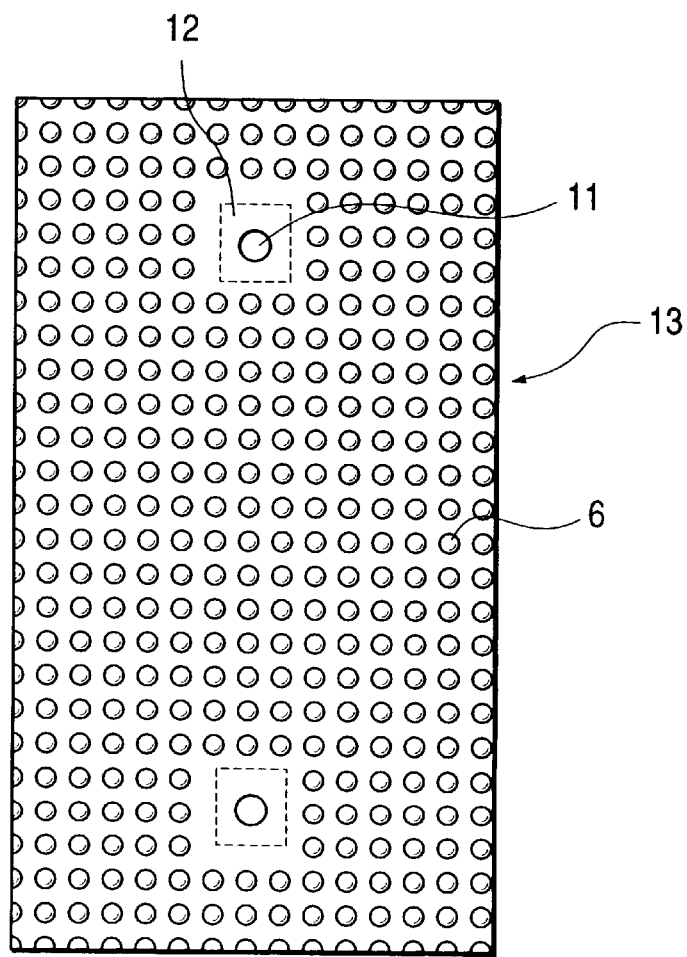
FIG. 4 is a plan view of a reinforcing sheet used in Example 1 of the solar-cell module of the present invention.

FIG. 4 shows an example of a reinforcing sheet having no unevenness in the terminal lead-out box bonding region. In FIG. 4, reference numeral 6 denotes unevenness; 11, a hole; and 12, the terminal lead-out box bonding region. This can promise the following effect on operation and also brings about an improvement in electrical reliability of the solar-cell module.

(1) The terminal lead-out box can be bonded without need of taking up the unevenness, and hence the members to which it is bonded can be selected from various kinds of materials.

(2) Even if any force of peeling the terminal lead-out box is applied by, e.g., pulling the cable connected to the terminal lead-out box, the peel stress by no means localizes on convex portions because the adhered surface has no unevenness, and hence the terminal lead-out box can have a high peel strength.

The sealing of the photovoltaic device with the filler material and the fixing thereof to the reinforcing sheet may be carried out by the same methods as those described on the prior art. Any filler material 3 and light-transmissive surface protective film 4 having protruded from the reinforcing sheet 5 may preferably be cut off.

Employment of the present manufacturing method can make it easy to use a large-size manufacturing apparatus with a simple construction. Since it can be made easy to use a large-size manufacturing apparatus, the solar-cell module that can be produced can be made to have a large size and a large area with ease, making it possible to meet various demands. Here, employing the means of the present invention can solve the problem occurring when the air is removed from the space between members, which may occur concurrently when the solar-cell module is made to have a large size and a large area.

The respective constituent materials will be described below.

(Reinforcing sheet 5)

There are no particular limitations on the reinforcing sheet used on the back of the solar-cell module in the present invention, so long as it has the unevenness on its surface at least on the side of the photovoltaic device and at least partly on that surface. As the shape of the reinforcing sheet, however, it may preferably have the shape of a sheet. As materials therefor, it may be made of a material including carbon fiber, FRP (glass fiber reinforced plastic), ceramic and glass. Particularly preferably a sheet made of a metal may be used.

Use of the sheet made of a metal is advantageous in the following:
(1) The unevenness can be formed with ease. For example, it can be readily formed by press molding carried out using a mold having the desired unevenness.
(2) Since the sheet can have a flexibility, a solar-cell module that can be fixed also to a crooked or curved part can be obtained.
(3) Its side portion can be worked by bending or perforation so that the solar-cell module can be fixed by utilizing the bent or perforated part.
(4) The sheet can be worked by bending to form a solar-cell integral type building material.

Here, the metal may preferably be of a material having a good weatherability, a good corrosion resistance and a good bending workability. For example, it may include galvanized steel sheets, steel sheets obtained by further coating galvanized steel sheets with a weatherable substance such as fluorine resin or vinyl chloride, and stainless steel sheets.

Figure 13A:
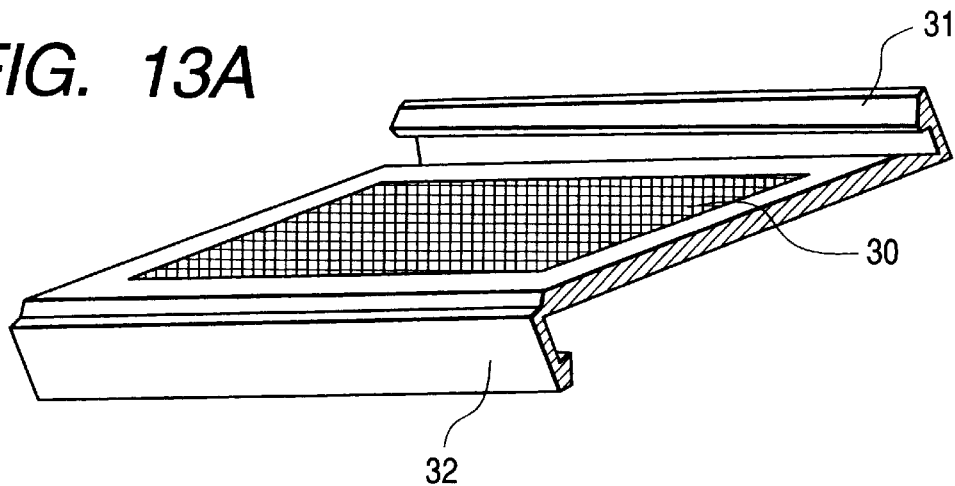
FIGS. 13A, 13B and 13C illustrate an example of a building material according to the present invention.
Figure 13B:
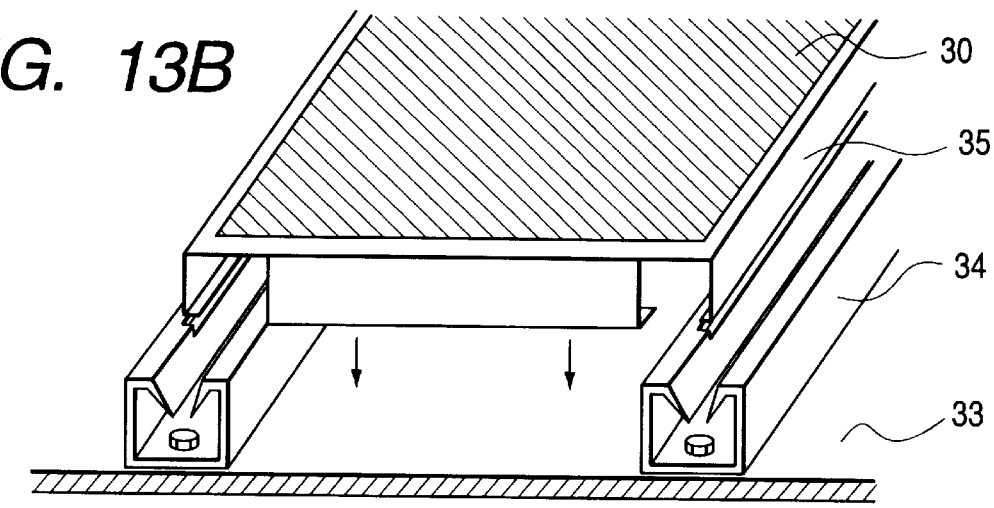
Figure 13C:
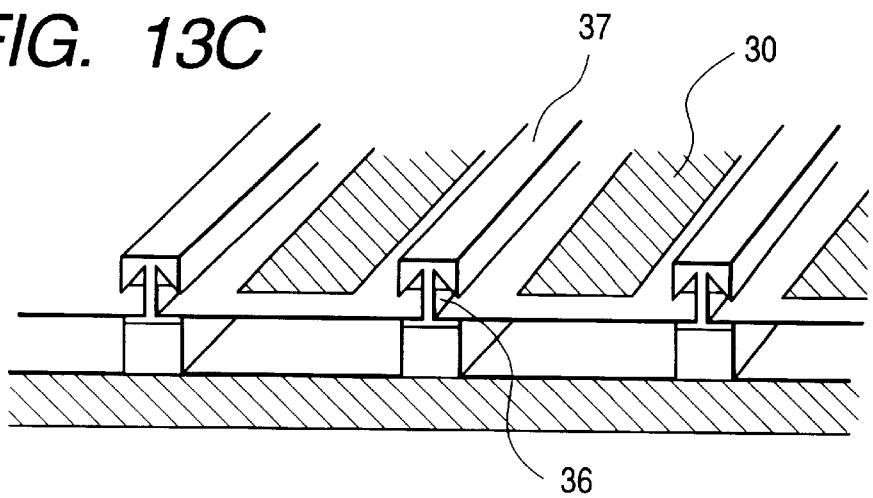

FIGS. 13A to 13C illustrate examples of the shape in which the reinforcing sheet is worked into a roofing material. FIG. 13A is a schematic perspective view of a roofing material having a ridge-side engaging part 31 and an eaves-side engaging part 32 which are alternately overlap-engageable with those of other roofing materials. FIG. 13B is a schematic perspective view showing a part of a roofing material whose engaging part 35 is inserted to a fixing member 34 fixed onto a roofboard 33. FIG. 13C is a schematic perspective view showing a part of a roofing material whose part 36 engageable with roofing materials adjacent to each other is engaged through a cap 37. A photovoltaic device 30 is provided on the light-receiving side of each roofing material. As to the roofing material shown in FIG. 13A, roofing materials are laid by repeating the operation of firstly fixing the eaves-side engaging part 32 of a first roofing material to the roofboard by means of a fixing member such as a hanger, then overlap-engaging to its ridge-side engaging part 31 the eaves-side engaging part 32 of a like second roofing material, and fixing the eaves-side engaging part 32 of the second roofing material to the roofboard by means of a hanger.

(Unevenness 6 on reinforcing sheet)

The unevenness provided on the reinforcing sheet of the solar-cell module of the present invention requires no particular limitation. However, the may preferably be so formed as to extend to the edges of the reinforcing sheet. Thus, the passage of air can by no means be closed throughout the course, so that the trapped air portions can be made to more hardly occur.

Figure 5:
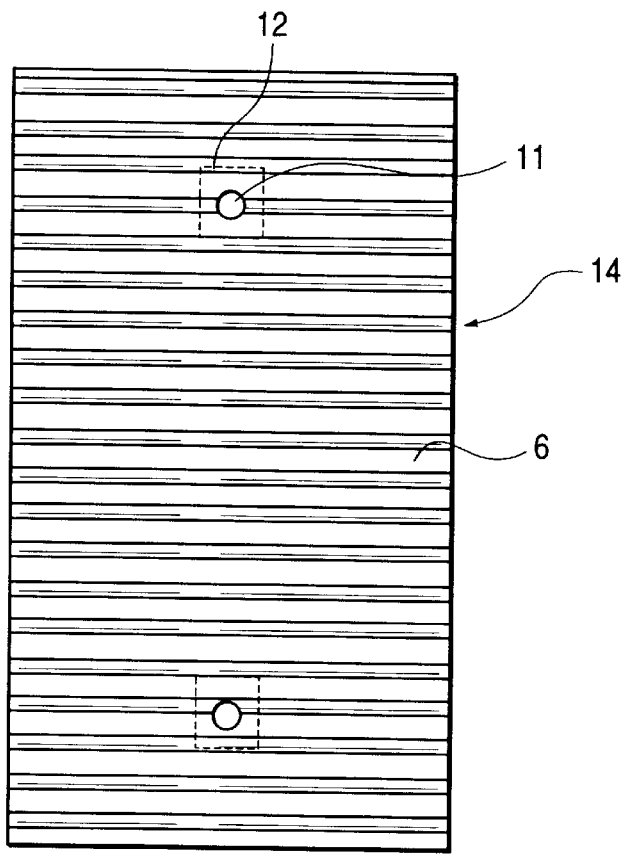
FIG. 5 is a plan view of a reinforcing sheet used in Example 2 of the solar-cell module of the present invention.

The unevenness may be in the form as shown in FIGS. 2 and 3. It may more preferably be in the form as shown in FIG. 5 in which a reinforcing sheet 14 has unevenness in the form of lines. In FIG. 5, reference numeral 11 denotes a hole; and 12, a terminal lead-out box bonding region. Since the reinforcing sheet has the unevenness in which convex and concave portions are arranged in lines, the air present between members can be removed in the direction arbitrarily intended by manufacturers. For example, when a solar-cell module is produced using a long rectangular reinforcing sheet, the air may be removed in the short-side direction so that it can be removed in a shorter distance and at a smaller resistance. Hence, such unevenness arranged in lines substantially parallel to the short-side direction can provide parallel passages of air along unevenness arranged in lines, so that the removal of air can be more improved.

The unevenness arranged in lines are also extended in the uniform direction, and hence the unevenness arranged in lines function as reinforcing ribs to bring about an improvement in flexural rigidity against a force that acts to bend the sheet in the direction perpendicular to the direction in which the unevenness arranged in lines are extended, and bring about an improvement in strength of the solar-cell module on the whole. Accordingly, although the conventional solar-cell module is provided with the frame material on the side portion of the solar-cell module in order to supplement its flexural rigidity, it is unnecessary to provide such a frame material in the direction parallel to the direction in which the unevenness arranged in lines are extended. This can achieve a cost reduction.

Figure 6:
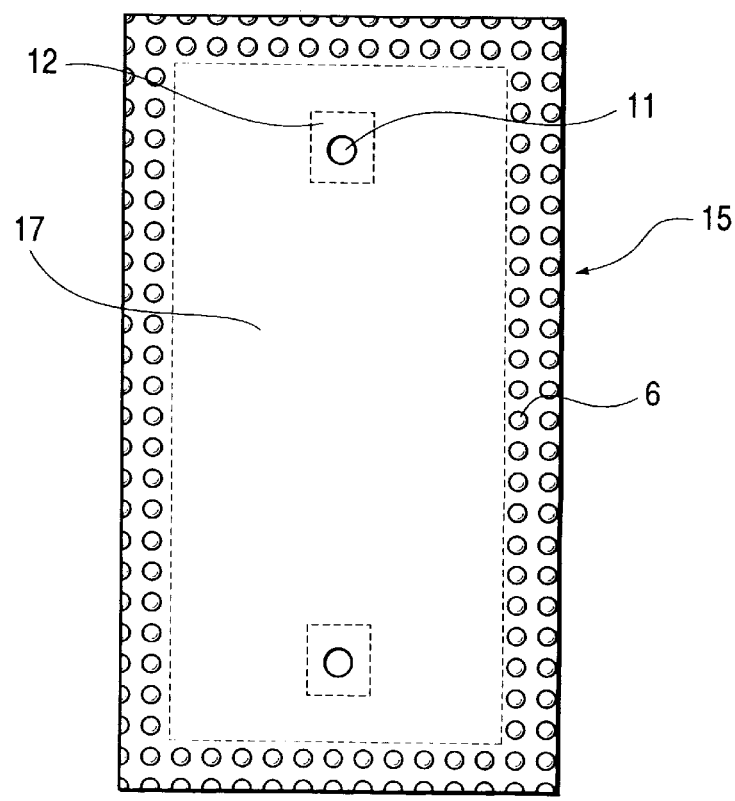
FIG. 6 is a plan view of a reinforcing sheet used in Example 3 of the solar-cell module of the present invention.

FIG. 6 shows an example of a different unevenness. In a reinforcing sheet 15 shown in FIG. 6, a region 17 indicated by dotted lines is a part where the photovoltaic device is placed. No unevenness 6 is provided in this region, and unevenness 6 is formed on its outside region. In FIG. 6, reference numeral 11 denotes a hole; and 12, a terminal lead-out box bonding region.

Figure 7:
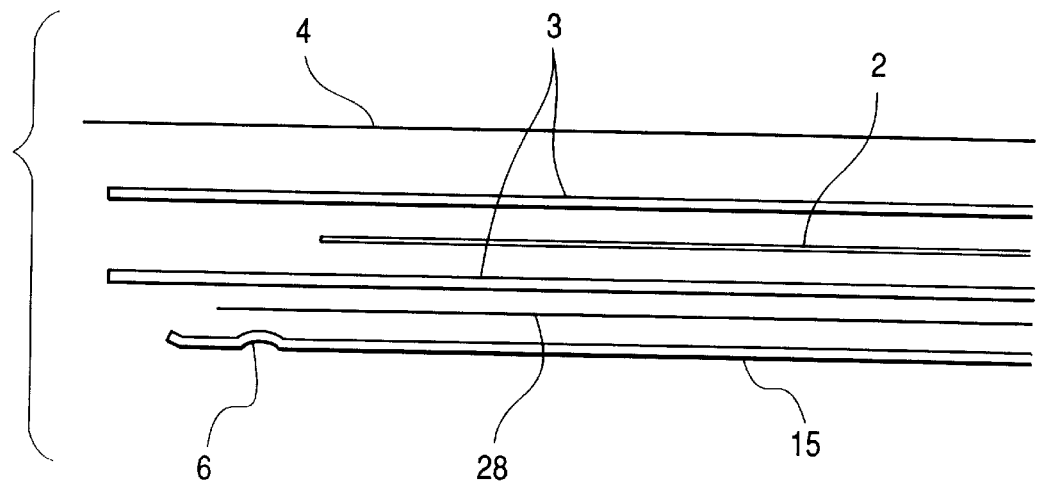
FIG. 7 is a partially enlarged cross-sectional view showing how the constituent materials are superposed in order to produce the solar-cell module of Example 3 according to the present invention.
Figure 8:
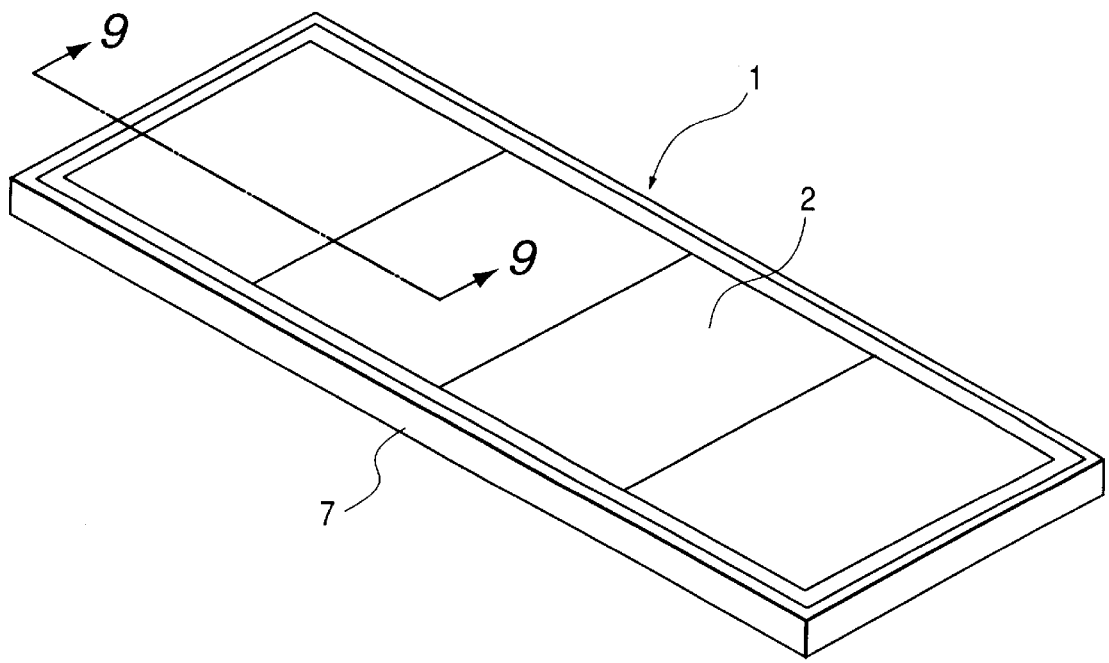
FIG. 8 is a perspective view showing a conventional solar-cell module.
Figure 9:
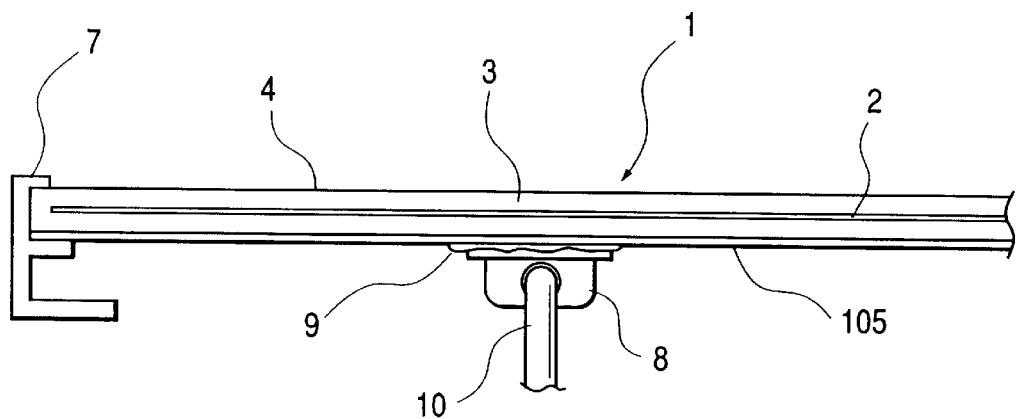
FIG. 9 is a cross-sectional view showing the conventional solar-cell module.

FIG. 7 is a cross-sectional view of a solar-cell module having the reinforcing sheet shown in FIG. 6, whose constituent members have not been sealed. In FIG. 7, a sheet member 28 formed of a fibrous material is so provided as to extend over the region where a photovoltaic device 2 is placed and to the unevenness portion, and also to be positioned between the reinforcing sheet 15 and a filler material 3. In FIG. 7, reference numeral 4 denotes a protective film; and 6, the unevenness.

With this constitution, the unevenness can be kept from affecting the photovoltaic device. For example, even the use of a photovoltaic device having no flexibility such as a crystalline silicon photovoltaic device may not cause such a trouble that the device is broken when pressed down under atmospheric pressure. Also, in the case of a photovoltaic device having a flexibility as in an amorphous-silicon photovoltaic device formed on a stainless steel substrate, the device may have such an appearance that the unevenness of the reinforcing sheet has been reflected on the photovoltaic device, and hence some viewers may consider it undesirable from the viewpoint of design and may dislike it. However, according to the present embodiment, the pattern of the unevenness by no means appears, and a solar-cell module which is beautiful from the viewpoint of design can be obtained.

On the other hand, since the photovoltaic device has no unevenness on the back, this constitution makes the air not so much removable with ease. However, the sheet member 28 formed of a fibrous material makes the removal of air easier. The sheet member 28 is held between the reinforcing sheet 15 and the filler material 3 to have the function to prevent the reinforcing sheet 15 and the filler material 3 from coming into close contact and also provides the voids of fibrous material as passages through which the air is removed. The fibrous sheet member 28 may also preferably not reach the edges of the reinforcing sheet 15. If the fibrous sheet member 28 reaches the edges of the reinforcing sheet 15, the edges may serve as paths of water infiltration, so that the reliability of the photovoltaic device 2 may be damaged. At the edges, not having this sheet member 28, the unevenness 6 of the reinforcing sheet 15 ensures the removing of air.

(Photovoltaic device 2)

There are no particular limitations on the photovoltaic device used in the solar-cell module of the present invention. As examples thereof, it may include crystalline-silicon photovoltaic devices, polycrystalline-silicon photovoltaic devices, microcrystalline-silicon photovoltaic devices, amorphous-silicon photovoltaic devices, copper-indium-selenide photovoltaic devices and compound semiconductor photovoltaic devices. It may preferably be a photovoltaic device having a flexibility, and may particularly preferably be an amorphous-silicon photovoltaic device formed on a stainless steel substrate. The use of the photovoltaic device having a flexibility may not cause such a trouble that the photovoltaic device is broken when it is placed on the unevenness of the reinforcing sheet and pressed down under atmospheric pressure. As the photovoltaic device having a flexibility, the amorphous-silicon photovoltaic device formed on a stainless steel substrate may be used, where, since the device has a rigidity by itself compared with, e.g., a photovoltaic device having a film as its substrate, gaps can be formed between it and the filler material with ease and passages through which the air between members is removed can be ensured, so that the removal of air can be more improved.

(Filler material 3)

The filler material 3 protects the photovoltaic device from severe external environment such as temperature changes, humidity and impact and also ensures the bond of the surface film and/or the reinforcing sheet to the device. It may be formed of a material including polyolefin resins such as ethylene/vinyl acetate copolymer (EVA), ethylene/methyl acrylate copolymer (EMA), ethylene/ethyl acrylate copolymer (EEA) and butyral resin, urethane resin, and silicone resin. In particular, EVA may preferably be used for solar cells. The EVA is commonly cross-linked with an organic peroxide.

In order to ensure the insulation between the photovoltaic device 2 and the reinforcing sheet 5, an insulating film may be provided superposingly on the filler material. Materials therefor may include nylon, polyethylene terephthalate and polycarbonate. A material obtained by beforehand integrally laminating the above filler material, e.g., EVA or EEA to the both sides of the insulating film may be used, whereby the step of providing the filler material on the back can be simplified.

(Sheet member 28 formed of fibrous material)

The sheet member formed of a fibrous material, which is provided on the reinforcing sheet at its part not having the unevenness, in order to assist the removal of air, may be exemplified by a glass fiber nonwoven fabric and a glass fiber woven fabric. The glass fiber nonwoven fabric is preferred because it is available at a lower cost, and, when a thermoplastic resin is used as the filler material, the spaces between glass fibers can be filled with this thermoplastic resin with greater ease.

This fibrous material may be provided also between the photovoltaic device 2 and the surface protective film 4. This makes it possible to improve anti-scratch properties and to well protect the photovoltaic device from external environment with use of the resin in a small quantity.

(Surface protective film 4)

The surface protective film ensures the long-term reliability during outdoor exposure of solar-cell modules. It may be formed of a material including fluorine resins and acrylic resins. In particular, fluorine resins are preferred because of their superior weatherability and stain resistance. Stated specifically, polyvinylidene fluoride resin, polyvinyl fluoride resin and ethylene tetrafluoride-ethylene copolymer are available. From the viewpoint of weatherability, polyvinylidene fluoride resin is advantageous, whereas, from the viewpoint of achievement of both the weatherability and the mechanical strength and the point of transparency, ethylene tetrafluoride-ethylene copolymer is advantageous. To improve the adhesion to the filler material 3, the surface protective film may preferably be treated by corona treatment, plasma treatment, ozone treatment, ultraviolet irradiation, electron-ray irradiation or flame treatment on its surface coming into contact with the filler material.

The solar-cell module of the present invention and an electric-power conversion system may be used in combination to provide an electricity generation system. The electric-power conversion system may have the function to operate in cooperation with commercial electric power.

EXAMPLES

The present invention will be described below by giving Examples. The present invention is by no means limited to these Examples.

(Example 1)

The solar-cell module shown in FIG. 1 was produced, provided that a reinforcing sheet not having the unevenness in the terminal lead-out box bonding region 12 as shown in FIG. 4 was used as the reinforcing sheet 5. The unevenness was formed in such size that in FIG. 3 the convex portions were each in a width a of 7 mm, a height b of 1.5 mm and an adjacent convex portion center distance c of 7 mm. The unevenness was formed by roll pressing using a pair of rollers having the corresponding unevenness on their surfaces.

Here, as the photovoltaic device 2, an amorphous-silicon photovoltaic device comprising a stainless steel substrate of 125 $\mu$m thick and an amorphous-silicon semiconductor layer formed thereon was used. As the filler material 3, EVA resin (ethylene/vinyl acetate copolymer) was formed into a sheet of 450 $\mu$m thick, and two sheets were prepared and used on the surface and back of the photovoltaic device. As the light-transmissive surface protective film 4, a fluorine resin film of 50 $\mu$m thick was used, and as the reinforcing sheet 5 galvanized steel sheet of 0.4 mm thick.

In the reinforcing sheet 13 (FIG. 4) on which the unevenness 6 had been formed, at the time of press molding carried out to form the terminal lead-out hole 11, the terminal lead-out box bonding region 12 was formed over again to have a smooth surface using a mold used for the press molding. Accordingly, a structural double-backed adhesive tape of 0.5 mm thick was able to be used for the bonding of the terminal lead-out box. Compared with the silicone adhesive used in an example of the preferred embodiments, the double-backed adhesive tape did not take time to dry the adhesive to cure. Hence, the production process became very convenient because, e.g., no place was necessary for keeping solar-cell modules in order to dry adhesives to cure.

Figure 10:
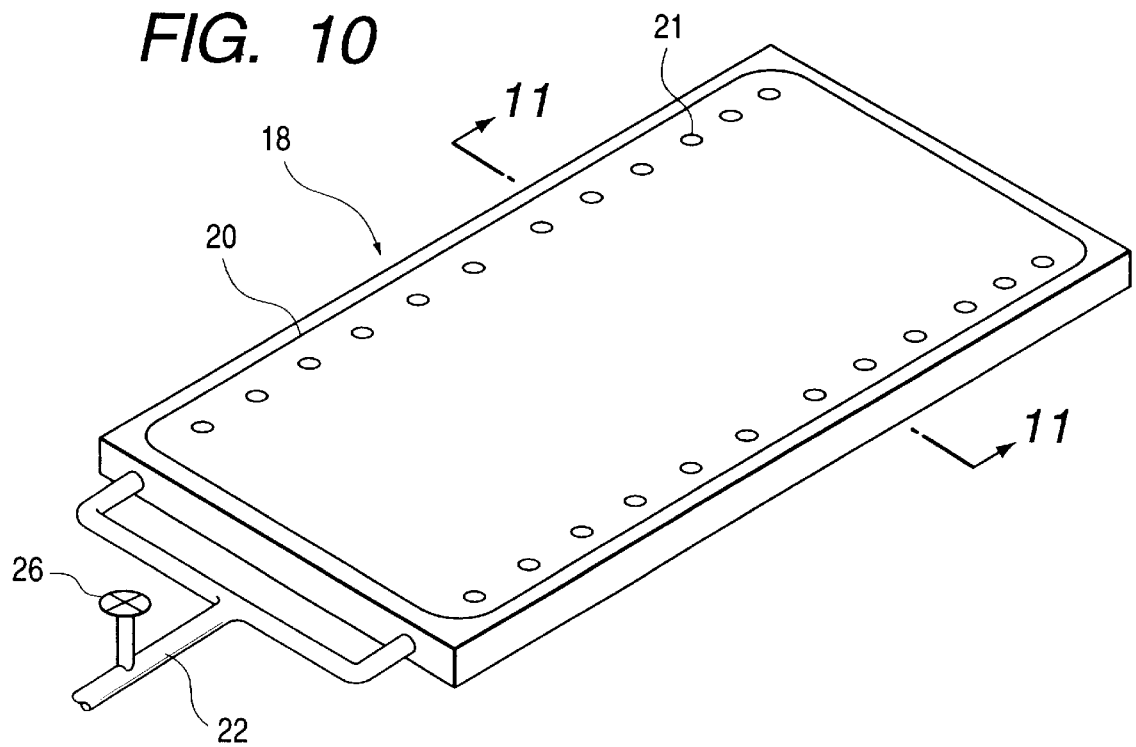
FIG. 10 is a perspective view showing a jig used to seal a solar-cell module with a resin.
Figure 11:
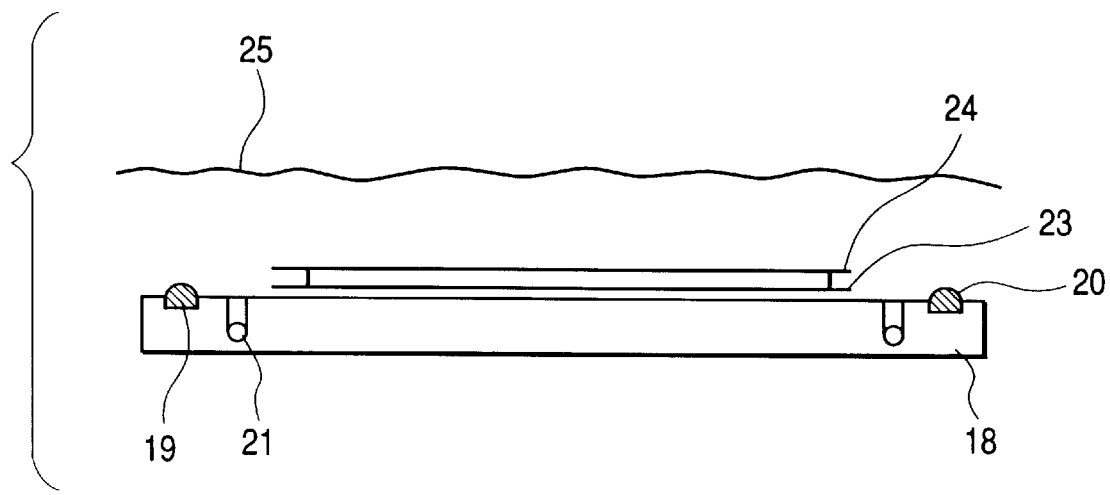
FIG. 11 is a cross-sectional view showing how the constituent materials are superposed on the jig in order to seal the solar-cell module with a resin.
Figure 12:
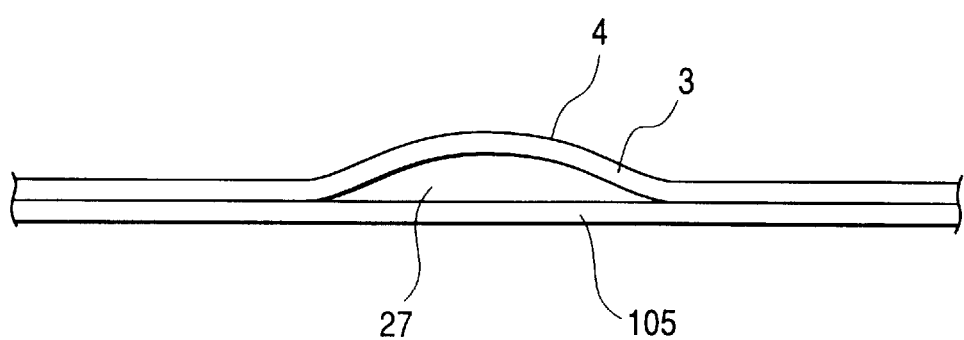
FIG. 12 is a cross-sectional view showing how trapped air portions are formed between a reinforcing sheet and a filler material.

Except for using the above reinforcing sheet, the solar-cell module was produced in the same manner as described in relation to the prior art. On the surface of the jig shown in FIGS. 10 and 11, the release Teflon film 23 was placed. On the surface of this release film, a laminate prepared by successively superposing the reinforcing sheet 5 placed at the lowest position, and thereon the sheet-like filler material 3, the photovoltaic device 2, the sheet-like filler material 3 and the surface protective film 4 were placed. The silicone rubber 25 was further placed thereon. Under this condition, the vacuum pump (not shown) was actuated to make the valve 26 open, so that the silicone rubber 25 was brought into close contact with the O-ring 20 and hence a closed space was formed which was defined by the silicone rubber 25, the O-ring 20 and the aluminum plate of the jig 18. The inside of the space stood vacuum. Thus, the reinforcing sheet, the filler material, the photovoltaic device, the filler material and the light-transmissive surface protective film were uniformly pressed against the jig 18 under atmospheric pressure through the silicone rubber 25.

Since the reinforcing sheet having the unevenness was used, the air was smoothly removed and any air bubbles did not remain between the reinforcing sheet and the filler material.

The jig 18 standing as stated above was put into a heating oven while keeping the vacuum pump operating, i.e., while maintaining the vacuum condition. The temperature in the heating oven was maintained at a temperature higher than the melting point of the filler material. After the filler material had been heated to the temperature higher than its melting point to become soft and the time for which it completed a chemical change for exhibiting a sufficient adhesive force had lapsed, the jig having been kept standing vacuum was taken out of the heating oven. This was cooled to room temperature, and thereafter the vacuum pump was stopped operating, and the silicone rubber 25 was removed so as to be released from the vacuum condition. Thus, the solar-cell module was obtained.

(Example 2)

A solar-cell module of the present Example was produced in the same manner as in Example 1 except that the reinforcing sheet was replaced with a reinforcing sheet having the unevenness in which concave and convex portions are arranged in lines as shown in FIG. 5. The unevenness arranged in lines shown in FIG. 5 was so formed that the portions convex toward the photovoltaic device side were each in a width of 7 mm, a height of 2 mm and at intervals of 10 mm. Here, the convex portions 16 functioned as reinforcing ribs and hence they brought about a higher flexural rigidity in the direction perpendicular to the direction in which the convex portions 16 were extended, and brought about a great improvement in strength of the solar-cell module on the whole.

(Example 3)

A solar-cell module of the present Example was produced in the same manner as in Example 1 except that the reinforcing sheet was replaced with a reinforcing sheet having such features that as shown in FIGS. 6 and 7 the unevenness was not provided in the region 17 where the photovoltaic device was placed, and the sheet member 28 formed of a fibrous material was provided in that region. As the sheet member 28 formed of a fibrous material, a nonwoven fabric formed of glass fiber was used. This nonwoven fabric was formed of glass fiber having a line diameter of 10 $\mu$m, and was made in a cloth weight of 20 g/m$^2$ and in a thickness of 100 $\mu$m. This enabled prevention of air bubbles from remaining between the members and also enabled the finished solar-cell module to have a desirable appearance.

As described above, according to the present invention, no trapped air portions were formed between the filler material and the reinforcing sheet when the solar-cell module is produced by sealing a photovoltaic device with the filler material and fixing it to the reinforcing sheet. Hence, any defectives for the reason of appearance were not yielded, making it possible to improve productivity. Also, there came to be no possibility of causing a lowering of electrical performance, bringing about a great improvement in reliability and also an improvement in heat dissipation efficiency.

What is claimed is:

1. A solar-cell module comprising photovoltaic device sealed on a reinforcing sheet with a filler material, wherein;
   the reinforcing sheet has unevenness formed by plastic deformation on its surface at least on the side of the photovoltaic device, wherein the unevenness is present at least in a portion other than a portion where the photovoltaic device is provided, and the unevenness consists of a plurality of concave portions and convex portions, such that the concave portions do not pass through the reinforcing sheet, and a space defined by the unevenness and the photovoltaic device is filled with the filler material.

2. The solar-cell module according to claim 1, wherein the filler material comprises a sheet member formed of a thermoplastic resin.

3. The solar-cell module according to claim 1, wherein convex and concave portions of the unevenness are arranged in lines.

4. The solar-cell module according to claim 1, wherein the photovoltaic device has a flexibility.

5. The solar-cell module according to claim 4, wherein the photovoltaic device having a flexibility is an amorphous-silicon photovoltaic device formed on a stainless steel substrate.

6. The solar-cell module according to claim 1, wherein at least part of the unevenness extends to the edges of the reinforcing sheet.

7. The solar-cell module according to claim 1, wherein the reinforcing sheet has no unevenness on its non-light-receiving side at least in a region corresponding to a region where a terminal lead-out box is bonded.

8. The solar-cell module according to claim 1, wherein the reinforcing sheet has no unevenness at its region where the photovoltaic device is placed.

9. The solar-cell module according to claim 8, wherein a sheet member formed of a fibrous material is provided in contact with a region where the reinforcing sheet has no unevenness and overlaps with a region where the reinforcing sheet has the unevenness.

10. The solar-cell module according to claim 1, which further comprises an insulating member provided between the reinforcing sheet and the photovoltaic device.

11. An electricity generation system comprising the solar-cell module according to claim 1 and an electric-power conversion system connected to the solar-cell module.

12. A process for producing a solar-cell module, comprising the steps of:
   superposing at least a thermoplastic-resin sheet member and a photovoltaic device on a reinforcing sheet having unevenness on its surface at least on the side of the photovoltaic device, the unevenness being present at least in a portion other than a portion where the photovoltaic device is provided, wherein the unevenness consists of a plurality of concave portions and convex portions such that the concave portions do not pass through the reinforcing sheet; and
   heating the thermoplastic-resin sheet member, the photovoltaic device and the reinforcing sheet while removing air form a space between the reinforcing sheet and the thermoplastic-resin sheet member and a space between the thermoplastic-resin sheet member and the photovoltaic device, to bring them into close contact to fix to each other.

13. The process according to claim 12, wherein convex and concave portions of the unevenness are arranged in lines.

14. The process according to claim 12, wherein the photovoltaic device has a flexibility.

15. The process according to claim 14, wherein the photovoltaic device having a flexibility is an amorphous-silicon photovoltaic device formed on a stainless steel substrate.

16. The process according to claim 12, wherein at least part of the unevenness extends to the edges of the reinforcing sheet.

17. The process according to claim 12, wherein the reinforcing sheet has no unevenness on its non-light-receiving side at least in a region corresponding to a region where a terminal lead-out box is bonded.

18. The process according to claim 17, wherein the reinforcing sheet is punched by means of a press molding machine to make a hole for leading out a terminal, in the course of which the region corresponding to a region where a terminal lead-out box is bonded is made smooth by the use of a mold for the punching.

19. The process according to claim 12, wherein the reinforcing sheet has no unevenness at its region where the photovoltaic device is placed.

20. The process according to claim 19, wherein a sheet member formed of a fibrous material is further superposed in contact with a region where the reinforcing sheet has no unevenness and overlaps with a region where the reinforcing sheet has the unevenness.

21. The process according to claim 12, wherein an insulating member is further superposed between the reinforcing sheet and the photovoltaic device.

22. A building material comprising a photovoltaic device sealed on a reinforcing sheet with a filler material, wherein;
the reinforcing sheet has unevenness on its surface at least on the side of the photovoltaic device, wherein the unevenness is present at least in a portion other than a portion where the photovoltaic device is provided, and the unevenness consists of a plurality of concave portions and convex portions, such that the concave portions do not pass through the reinforcing sheet, and a space defined by the unevenness and the photovoltaic device is filled with the filer material.

23. A method for laying building materials, comprising fixing the building material according to claim 22 onto a roofboard by means of a fixing member, and fixing adjacent building materials to each other.

24. A process for producing a building material, comprising the steps of:
superposing at least a thermoplastic-resin sheet member and a photovoltaic device on a reinforcing sheet having unevenness on its surface at least on the side of the photovoltaic device, the unevenness being present at least in a portion other than a portion where the photovoltaic device is provided, the unevenness consisting of a plurality of concave portions and convex portions such that the concave portions do not pass through the reinforcing sheet; and
heating the thermoplastic-resin sheet member, the photovoltaic device and the reinforcing sheet while removing air form a space between the reinforcing sheet and the thermoplastic-resin sheet member and a space between the thermoplastic resin sheet member and the photovoltaic device, to bring them into close contact to fix each other.

25. A solar-cell module comprising a photovoltaic device sealed on a reinforcing sheet with a filler material, wherein;
the reinforcing sheet has unevenness on its surface at least on the side of the photovoltaic device, wherein the unevenness is present at least in a portion other than a portion where the photovoltaic device is provided, and the unevenness consists of a plurality of concave portions and convex portions, such that the concave portions do not pass through the reinforcing sheet, and a space defined by the unevenness and the photovoltaic device is filled with the filler material; a width of each convex portion of the unevenness and a center distance between convex portions thereof which are adjacent to each other being in the range from 0.1 mm to 50 mm, and a height of each convex portion being in the range from 0.1 mm to 10 mm.

26. The solar-cell module according to claim 25, wherein the filler material comprises a sheet member formed of a thermoplastic resin.

27. The solar-cell module according to claim 25, wherein convex and concave portions of the unevenness are arranged in lines.

28. The solar-cell module according to claim 25, wherein the photovoltaic device has a flexibility.

29. The solar-cell module according to claim 28, wherein the photovoltaic device having a flexibility is an amorphous-silicon photovoltaic device formed on a stainless steel substrate.

30. The solar-cell module according to claim 25, wherein at least part of the unevenness extends to the edges of the reinforcing sheet.

31. The solar-cell module according to claim 25, wherein the reinforcing sheet has no unevenness on its non-light-receiving side at least in a region corresponding to a region where a terminal lead-out box is bonded.

32. The solar-cell module according to claim 25, wherein the reinforcing sheet has no unevenness at its region where the photovoltaic device is placed.

33. The solar-cell module according to claim 32, wherein a sheet member formed of a fibrous material is provided in contact with a region where the reinforcing sheet has no unevenness and overlaps with a region where the reinforcing sheet has the unevenness.

34. The solar-cell module according to claim 25, which further comprises an insulating member provided between the reinforcing sheet and said photovoltaic device.

35. A solar-cell module comprising a photovoltaic device sealed on a reinforcing sheet with a filler material, wherein;
the reinforcing sheet has unevenness in which convex and concave portions are arranged in lines on its surface at least on the side of the photovoltaic device, wherein the unevenness is present at least in a portion other than a portion where the photovoltaic device is provided, and the unevenness consists of a plurality of concave portions and convex portions, such that the concave portions do not pass through the reinforcing sheet, and a space defined by the unevenness and the photovoltaic device is filled with the filler material.

36. The solar-cell module according to claim 35, wherein the filler material comprises a sheet member formed of a thermoplastic resin.

37. The solar-cell module according to claim 35, wherein the photovoltaic device has a flexibility.

38. The solar-cell module according to claim 37, wherein the photovoltaic device having a flexibility is an amorphous-silicon photovoltaic device formed on a stainless steel substrate.

39. The solar-cell module according to claim 35, wherein at least part of the unevenness extends to the edges of the reinforcing sheet.

40. The solar-cell module according to claim 35, wherein the reinforcing sheet has no unevenness on its non-light-receiving side at least in a region corresponding to a region where a terminal lead-out box is bonded.

41. The solar-cell module according to claim 35, wherein the reinforcing sheet has no unevenness at its region where the photovoltaic device is placed.

42. The solar-cell module according to claim 41, wherein a sheet member formed of a fibrous material is provided in contact with a region where the reinforcing sheet has no unevenness and overlaps with a region where the reinforcing sheet has the unevenness.

43. The solar-cell module according to claim 35, which further comprises an insulating member provided between the reinforcing sheet and the photovoltaic device.

* * * * *

UNITED STATES PATENT AND TRADEMARK OFFICE
CERTIFICATE OF CORRECTION

PATENT NO.   : 6,075,202
DATED        : June 13, 2000
INVENTOR(S)  : MASAHIRO MORI ET AL.

It is certified that error appears in the above-identified patent and that said Letters Patent is hereby corrected as shown below:

COLUMN 2

Line 33, "materials members." should read --member materials--;
Line 41, "stands" should read --is maintained--;
Line 56, "stopped" should read --stopped from--; and
Line 64, "can not" should read --cannot--.

COLUMN 3

Line 8, "air 27" should read --trapped air 27--; and "up however it is tried" should read --up. However,--;
Line 9, "being sucked" should read --removal of the trapped air is attempted--;
Line 21, "having caused no problem of" should read --without--;
Line 31, "can not" should read --cannot--;
Line 36, "increase" should read --increases--;
Line 37, "decrease" should read --decreases--; and
Line 38, "on" should read --in--.

COLUMN 5

Line 24, "D," should read --b,--;
Line 25, "C," should read --c,--; and
Line 37, "unevenness shape" should read --an unevenness--.

UNITED STATES PATENT AND TRADEMARK OFFICE
CERTIFICATE OF CORRECTION

PATENT NO.  : 6,075,202
DATED       : June 13, 2000
INVENTOR(S) : MASAHIRO MORI ET AL.

It is certified that error appears in the above-identified patent and that said Letters Patent is hereby corrected as shown below:

COLUMN 6

Line 25, "takes up" should read --covers--; and
Line 46, "on" should read --in--.

COLUMN 7

Line 52, "the" should read --it--; and
Line 56, "hardly" should read --rarely--.

COLUMN 8

Line 18, "are" should read --is--.

COLUMN 10

Line 29, "in" should read --of--.

COLUMN 11

Line 6, "stood" should read --is maintained under--;
Line 24, "kept standing" should read --maintained under--;
Line 27, "stopped" should read --stopped from--;
Line 39, "in" should read --of--; and
Line 67, "defectives for the reason of" should read --defects in appearance--.

UNITED STATES PATENT AND TRADEMARK OFFICE
CERTIFICATE OF CORRECTION

PATENT NO.    : 6,075,202
DATED         : June 13, 2000
INVENTOR(S)   : MASAHIRO MORI ET AL.

It is certified that error appears in the above-identified patent and that said Letters Patent is hereby corrected as shown below:

COLUMN 12

Line 7, "photovoltaic device" should read
--a photovoltaic device--; and
Line 63, "form" should read --from--.

COLUMN 13

Line 43, "filer" should read --filler--; and
Line 61, "form" should read --from--.

Signed and Sealed this

Twenty-fourth Day of April, 2001

Attest:

NICHOLAS P. GODICI

Attesting Officer    Acting Director of the United States Patent and Trademark Office